United States Patent [19]

Parrish et al.

[11] Patent Number: 5,310,353
[45] Date of Patent: May 10, 1994

[54] ELECTRICAL POWER DISTRIBUTION CENTER HAVING CONDUCTIVE RIDGES

[75] Inventors: Steven R. Parrish, Utica; David E. Champlin, Port Huron, both of Mich.

[73] Assignee: Augat Inc., Mansfield, Mass.

[21] Appl. No.: 67,482

[22] Filed: May 25, 1993

Related U.S. Application Data

[63] Continuation of Ser. No. 900,243, Jun. 17, 1992, abandoned.

[51] Int. Cl.$^5$ ............................................. H01R 9/00
[52] U.S. Cl. ........................................... 439/76; 29/850
[58] Field of Search ............... 439/43, 76, 714, 721, 439/110-120; 361/394, 395, 399, 412; 29/850, 857

[56] References Cited

U.S. PATENT DOCUMENTS

| | | | |
|---|---|---|---|
| 3,132,913 | 5/1964 | Pohl | 439/397 |
| 3,858,155 | 12/1974 | Lacan et al. | 439/394 |
| 3,911,328 | 10/1975 | Haury et al. | 361/394 |
| 3,952,209 | 4/1976 | Shaklee et al. | 307/9 |
| 4,507,720 | 3/1985 | Colbrese | 363/13 |
| 4,684,765 | 8/1987 | Beck et al. | 29/850 |
| 4,798,545 | 1/1989 | Roy et al. | 439/677 |
| 4,820,189 | 4/1989 | Sergeant et al. | 439/395 |
| 4,983,128 | 1/1991 | Dale et al. | 439/111 |
| 5,008,493 | 4/1991 | Wagener | 439/110 |
| 5,023,752 | 6/1991 | Detter et al. | 361/399 |
| 5,057,026 | 10/1991 | Sawai et al. | 439/76 |

Primary Examiner—Neil Abrams
Attorney, Agent, or Firm—Weingarten, Schurgin, Gagnebin & Hayes

[57] ABSTRACT

A flexibly configurable power distribution center in which an electrical signal or power is routed by implementing an electrical interconnection at any point along a path of a conductor. Insulative portions or boards within an electrical power distribution center are fabricated having a plurality of recesses for receiving electrical conductors therein. The electrical conductors are in the form of flexibly configurable strips of metal such as steel, copper, brass or the like, which are disposed within the recesses in the insulating portions. The strips of metal are dimensioned and disposed within the recesses forming an exposed conductive ridge which is mechanically and electrically engageable by interface terminals along substantially the entire length of the conductor. The interface terminals have at least one female mating portion for mechanically mating with the conductive ridge to establish electrical continuity therewith. A plurality of recesses can be configured within the insulating portions, and the metal strip can be disposed within selected recesses or portions of recesses as desired to provide various alternative conductive trace configurations with the same insulative portion. The strip metal is cut to desired lengths for automated or manual installation within the selected recesses.

14 Claims, 7 Drawing Sheets

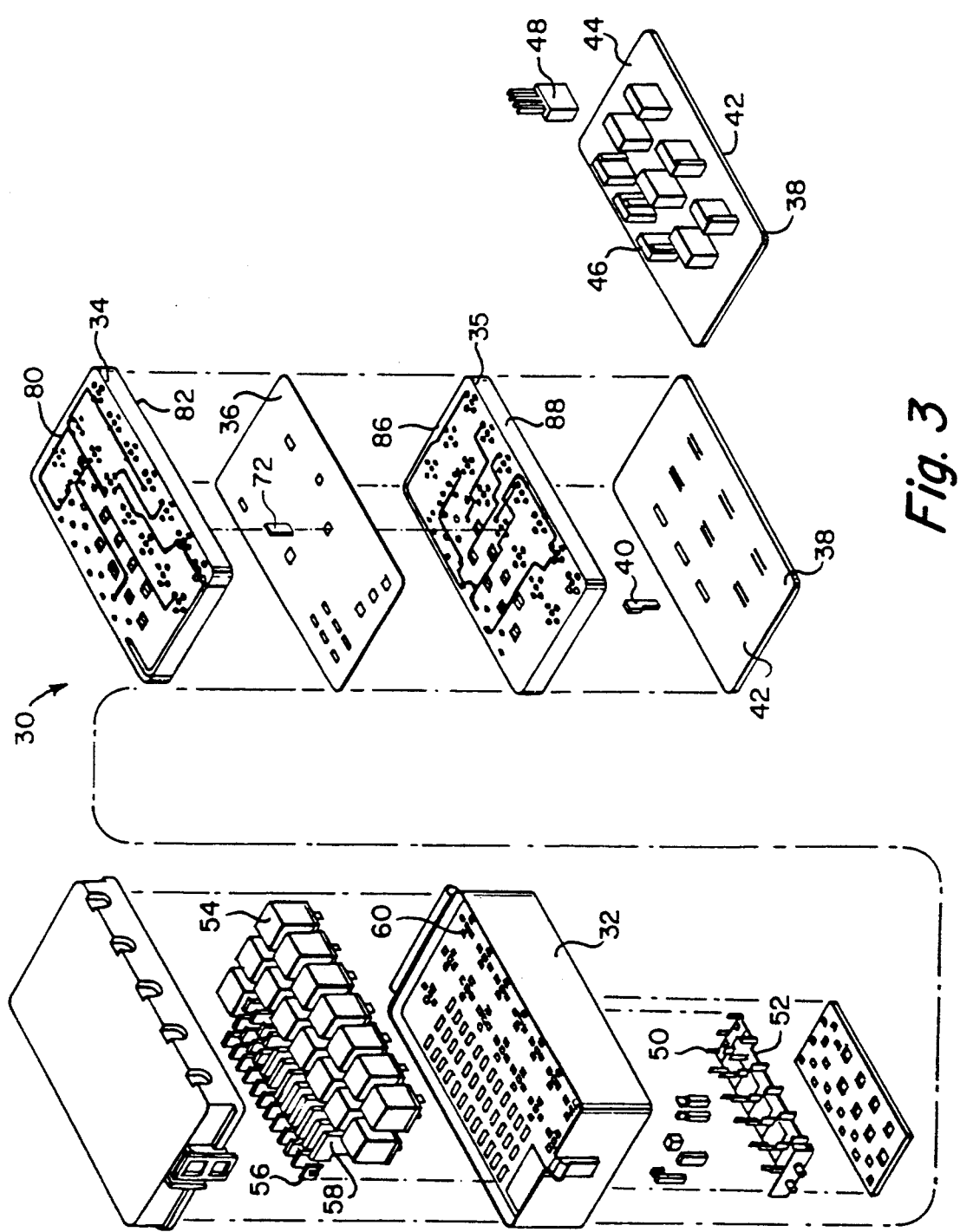

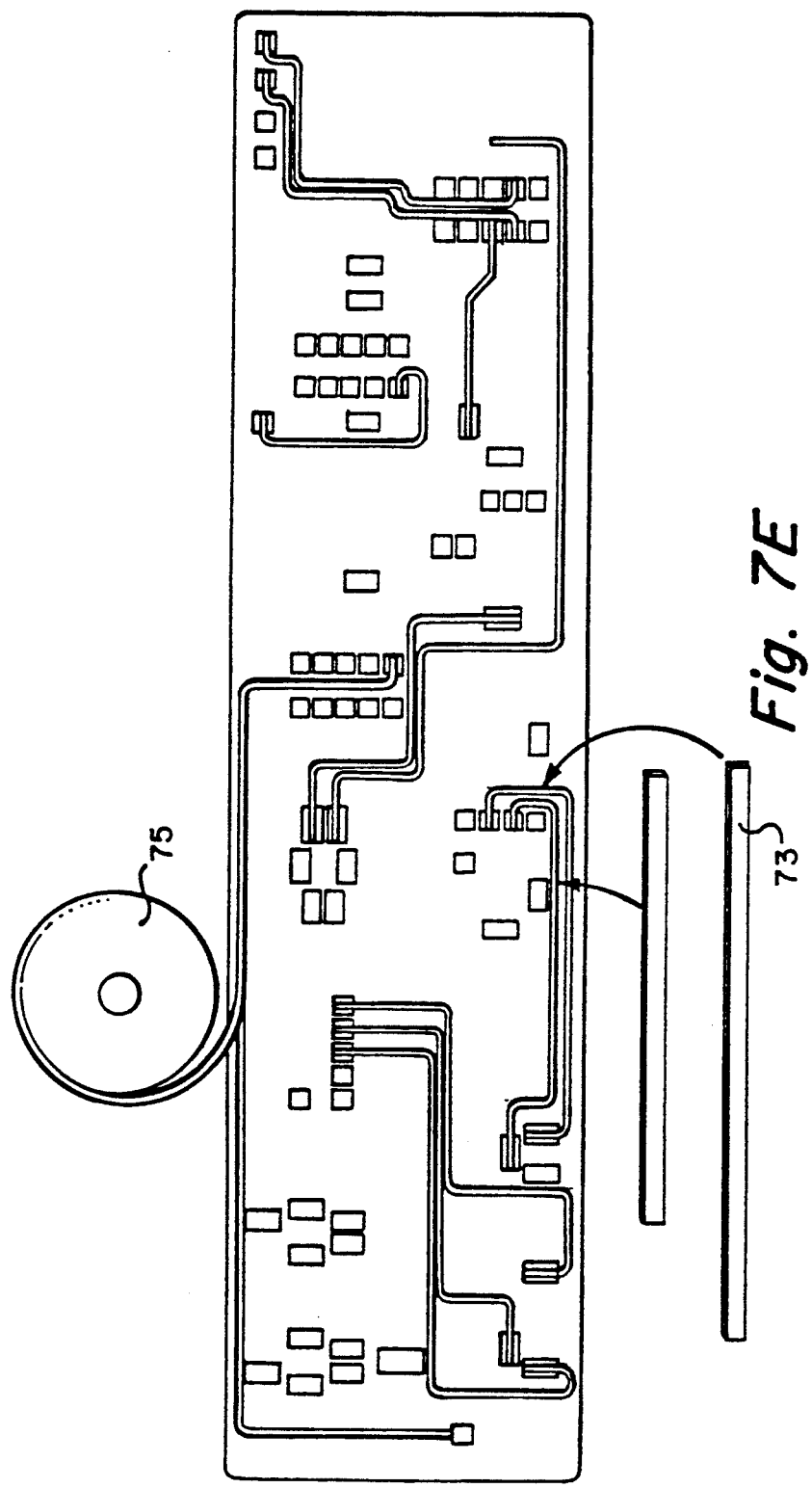

ELECTRICAL POWER DISTRIBUTION CENTER HAVING CONDUCTIVE RIDGES

This application is a continuation of application Ser. No. 07/900,243, filed Jun. 17, 1992, now abandoned.

FIELD OF THE INVENTION

The present invention relates to power/signal distribution centers, and in particular to automotive power/signal distribution centers for housing automotive fuses, relays, diodes, splices, capacitors, etc.

BACKGROUND OF THE INVENTION

Power distribution centers are known for housing automotive fuses and relays which are operative in the distribution of power throughout an electrical system of an automobile. Typical power distribution centers, such as the one described in U.S. Pat. No. 4,798,545, include an electrical component housing body containing a matrix of receptacle cavities for receiving electrical components such as relays, fuses, passive/active electronic components or the like. The electrical components disposed within the cavities engage a bus bar fabricated from electrically conductive material which is shaped to provide an electrical current path from power lead terminals to preselected receptacle cavities.

In this known implementation, illustrated in FIG. 1, the bus bar 10 is configured by stamping sheet steel in a configuration which permits the bending of mating terminals 12. The mating terminals are accessible to receptacles 14 located in preselected receptacle cavities 16. The receptacles 14 are double ended, receiving the mating terminal 12 at one end and a component terminal or lead 18 at the other end and providing an electrical path through the bus bar to an electrical power source. The bus bar 10 is protected from undesirable electrical shorts by an insulator 20 which includes openings that are aligned with the preselected cavities to permit access to the cavities so that receptacle wires or other components can pass through the insulator to effect electrical contact with the bus bar.

Such known power distribution centers, utilizing a stamped metal bus bar to distribute electrical signals, suffer a disadvantage in that the stamping and bending of the bus bar is a relatively elaborate, tool intensive process. The tooling required to stamp and bend the bus bar is costly and involves a process wherein a considerable amount of scrap is generated. The process of stamping and bending results in a bus bar configuration which is dedicated to a particular electrical component mounting configuration. Flexibility is severely limited in implementing such a power distribution center for a variety of electrical accessory options, because a dedicated bus bar must be stamped and bent for each of various particular configurations. Further, a variety of dedicated insulative portions of the housing which accommodates the bus bar, must be fabricated to receive each of the various particular bus bar configurations. Thus, numerous component parts and numerous power distribution centers must be manufactured to accommodate a variety of electrical accessory options.

Other electrical power distribution centers known in the art, implement conventional stamped lead technology, such as disclosed in U.S. Pat. No. 5,023,752. Conventional stamped lead technology, illustrated in FIGS. 2 and 2A, uses pre-stamped metal circuit elements 22, which are removably disposed in recesses in a plurality of stacked electrically insulative boards. The pre-stamped metal circuit elements 22 act as conductive traces to provide electrical interconnection between points. Male terminal blades 24 are formed on the pre-stamped metal circuit elements, and facilitate a contact surface for interconnection with female receptacles on electrical devices or wiring harnesses. The male terminal blades typically are located at ends of the pre-stamped metal circuit elements, significantly limiting interconnectability with the circuit elements. Interconnection with the female receptacles is feasible only at the points where the male terminal blades are located.

Other disadvantages are inherent in stamped lead technology, including the need for costly tooling required for the pre-stamping and bending of the metal circuit elements. The pre-stamped metal circuit elements generally result in considerable amounts of metal scrap as the metal elements are stamped from large sheets of metal which often cannot be optimally utilized in producing pre-stamped metal circuit elements of the shapes required for mounting in the recesses in the electrically insulative boards. The tooling requirements and scrap negatively impact the cost of producing such electrical power distribution centers, resulting in a relatively high piece part cost for stamped lead technology power distribution centers.

Additionally, as with other stamped conductive elements implemented in power distribution centers known in the art, there is very little flexibility in configuring such systems. The pre-stamped metal circuit elements must be particularly fabricated to fit within dedicated recesses in the insulative boards associated therewith. The recesses similarly must be particularly fabricated to accommodate dedicated pre-stamped metal circuit elements.

SUMMARY OF THE INVENTION

The present invention provides a flexibly configurable power distribution center in which an electrical signal and power can be routed by implementing an electrical interconnection at virtually any point along a path of a conductor.

According to the invention, insulative portions or boards within an electrical power distribution center are fabricated having a plurality or matrix of recesses for receiving electrical conductors therein. Electrical conductors are provided in the form of flexibly configurable strips of metal such as steel, brass, copper, or the like, which are disposed within the recesses in the insulating portions. The strips of metal are dimensioned having a height which is greater than their width and are disposed within the recesses, so as to form an exposed conductive ridge which is mechanically and electrically engageable by interface terminals along substantially the entire length of the conductor. The interface terminals have at least one female mating portion for mechanically mating with the conductive ridge to establish electrical continuity with the electrical conductor. A plurality of recesses can be configured within the insulating portions and the metal strip can be disposed within selected recesses or portions of recesses as desired to provide various alternative conductive trace configurations using the same insulative portion. The strip metal is cut to desired lengths for automated or manual installation within the selected recesses.

Features of the invention include great flexibility in routing electrical signals. A plurality of insulative portions can be stacked having alternative strip configurations to effect numerous alternate, selectable variations of power distribution centers. Strip metal cut to length and routed through selected recesses virtually eliminates waste associated with implementing various power distribution centers. Expensive tooling or process machinery is not required for configuring the conductive traces required in the power distribution center.

DESCRIPTION OF THE DRAWINGS

Other features and benefits of the invention can be more clearly understood with reference to the specification and the accompanying drawings in which:

FIG. 3 is an exploded perspective view of a power distribution center implementing vertically oriented strip stock in recesses according to the invention;

FIG. 7E is a plan view of an insulative portion having recesses disposed therein, reliefs for accessing the conductive ridge, and illustrating strip stock cut to length prior to disposition and strip stock disposed from a spool or reel and cut to length during insertion.

DETAILED DESCRIPTION

Figure 1:
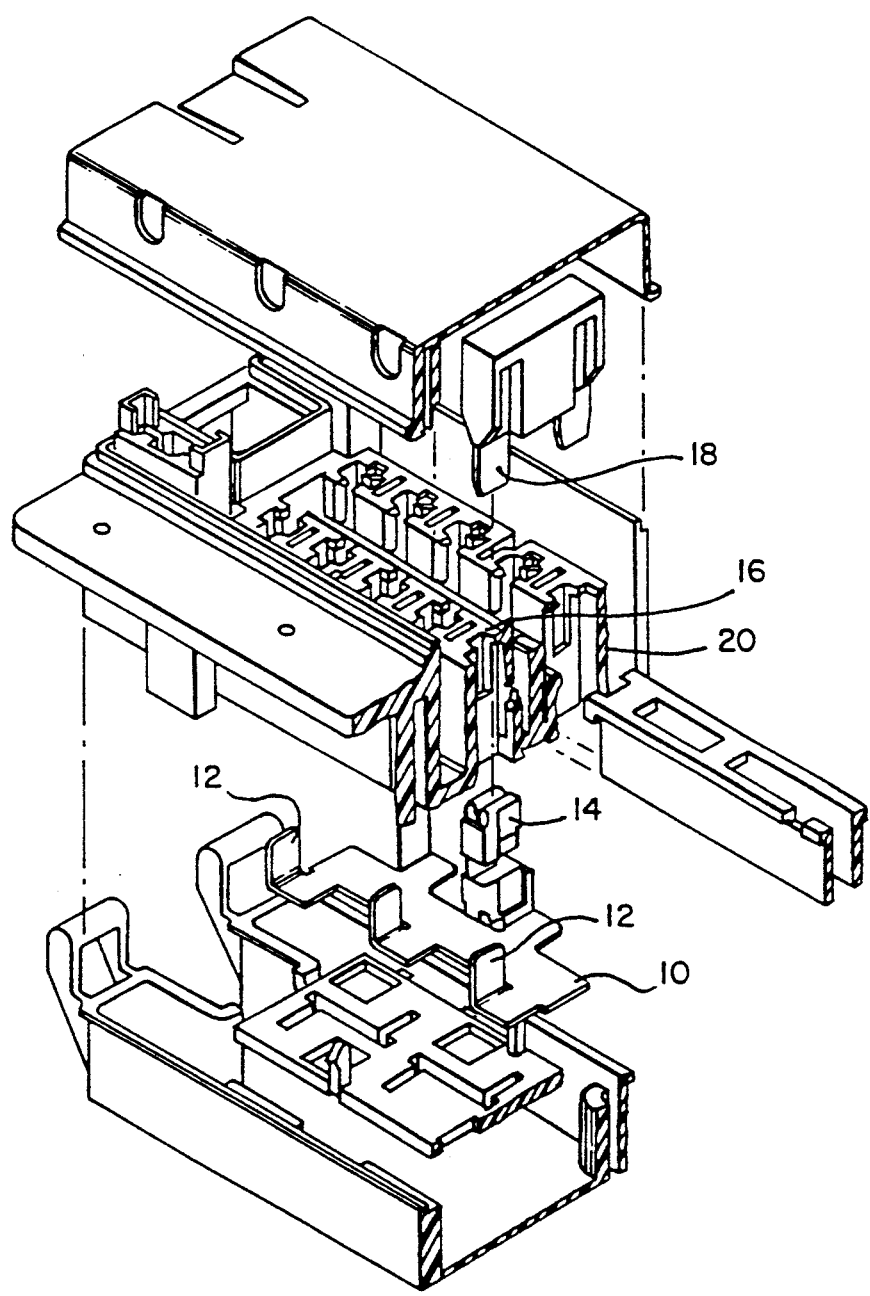
FIG. 1 is a perspective exploded view of a power distribution center having a stamped and bent bus bar according to the prior art.
Figure 2:
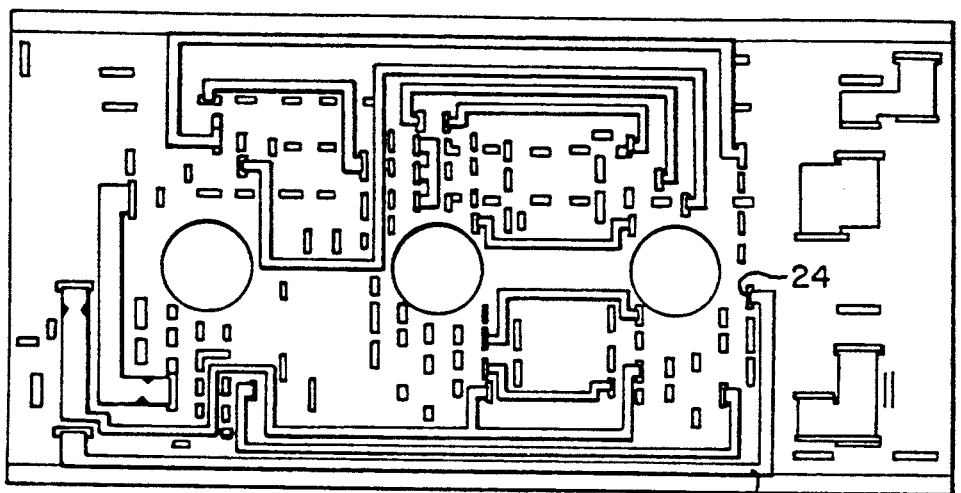
FIG. 2 is a plan view of an insulative board and prestamped circuit elements of a conventional stamped lead technology power distribution center according to the prior art.
Figure 2A:
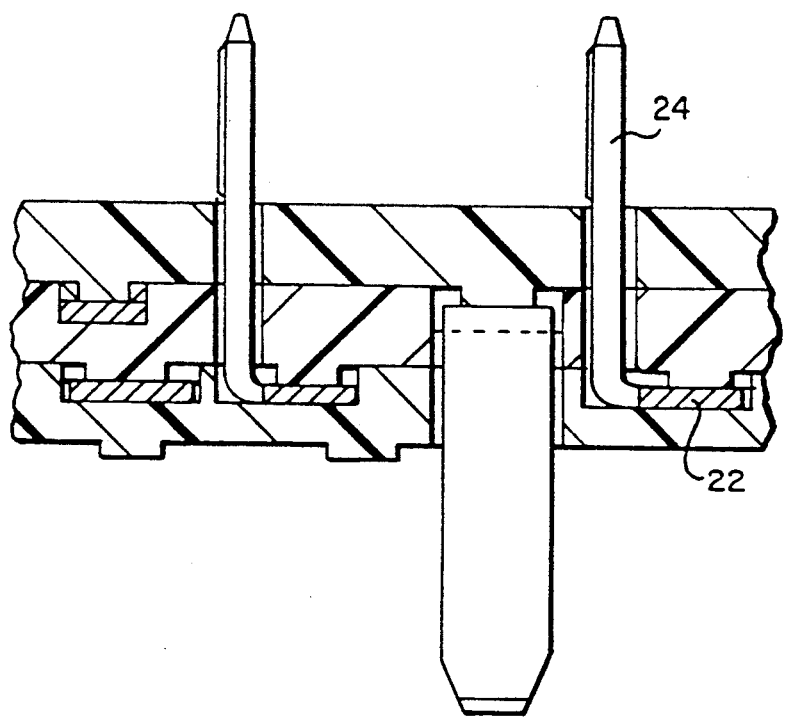
FIG. 2A is a side sectional view of a portion of the board and circuit element of FIG. 2 having male terminal blades extending therefrom.

Referring now to FIG. 3, a power distribution center 30 is comprised of a housing 32, which receives at least one insulative portion or board 34. In an illustrative embodiment, two insulative boards 34, 35 are shown separated by an insulative sheet 36 which has a plurality of openings exposed therein to facilitate physical access between the two insulative boards 34, 35. The stacked insulative boards with the spacer therebetween are disposed within the housing 32 with a bottom plate 38 thereunder. The bottom plate 38 receives a plurality of interconnection means 40 disposed on a top surface 42 thereof. A bottom surface 44 of the bottom plate 38 has a plurality of connector receptacles 46 for receiving connectors attached to wires or wiring harnesses 48, as known in the art.

Alternatively, a bottom side of the lower insulative board 35 disposed within the housing 32 may receive interconnection means or terminals 40 that accommodate terminal blades 50 from a stamped and bent bus bar 52 as known in the art and described hereinbefore. Power distribution components, such as ISO relays 54, mini fuses 56 and maxi fuses 58 are disposed on a matrix of receptacles 60 which electrically engage the conductive elements within recesses of the insulative boards 34, for routing electrical signals therethrough, as discussed hereinafter. The housing 32 is enclosed by a vented top cover 62.

Figure 4:
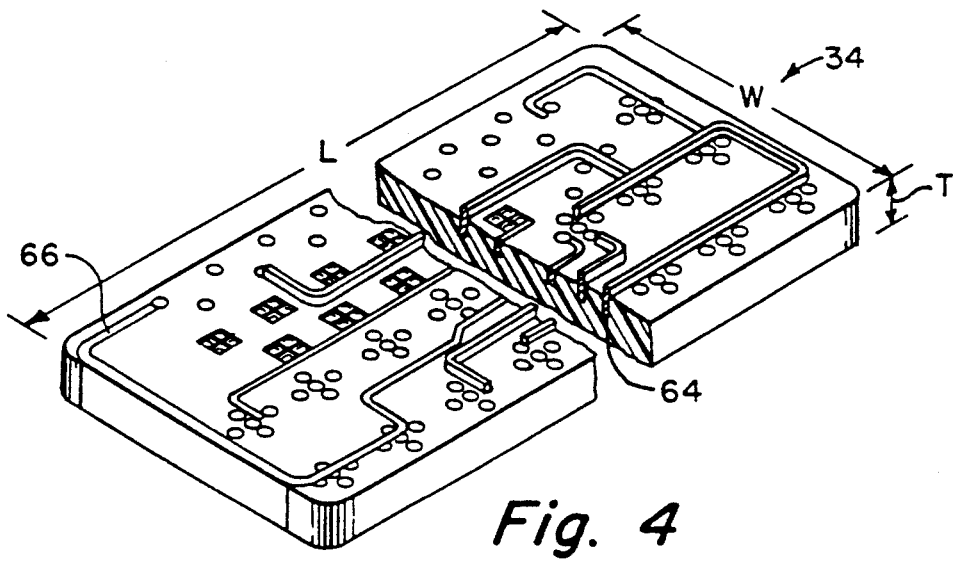
FIG. 4 is a perspective view partially in section of an insulative portion of the power distribution center of FIG. 3.
Figure 4A:
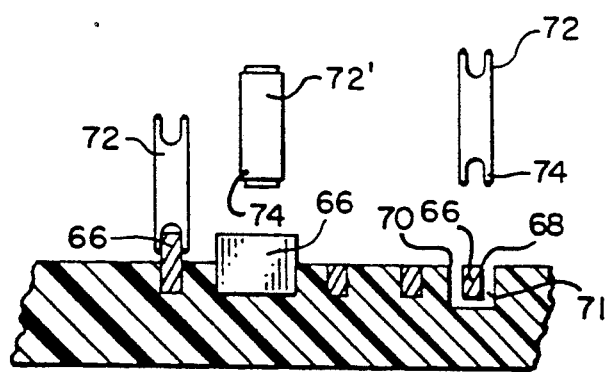
FIG. 4A is an end view partially broken away and in section of the insulative portion of FIG. 4, having strip stock disposed in recesses thereof and an interface terminal disposed thereabove.

The insulative board 34 configured with conductive elements for routing electrical signals within the illustrative power distribution center, are shown in greater detail in FIGS. 4 and 4A. The insulative board 34 is a substantially rectangular piece of insulative material such as plastic, dimensioned to be of a particular thickness. In this illustrative embodiment the insulative board 34 is 350 millimeters long, 80 millimeters wide and 9 millimeters thick. The particular dimensions are a function of the power distribution center implementation. The board 34 is configured having a plurality of recesses 64 disposed therein, the depth of the recesses being limited by the thickness of the insulative board 34. Thus, the thickness T of the insulative board represents a critical dimension as the depth of recesses, are limited by the thickness of the insulative board 34. Preferably the recesses are deep enough to accommodate vertically oriented conductive elements, as discussed hereinafter, while maintaining the structural integrity of the insulative board under various stresses.

Conductive buses 66 are implemented in the illustrative power distribution center by removably engaging vertically oriented strip stock within selected recesses 64. The strip stock which is of a substantially rectangular cross section, best illustrated in FIG. 4A, is "vertically" oriented such that the width 68 of the strip stock is orthogonally disposed with respect to a top surface 70 of the insulative board 34. The strip stock is preferably disposed within the recesses 64, as illustrated in FIG. 4A, such that the strip is flush with the top surface 70 of the insulative board 34. The strip provides a conductive ridge which is accessible via selectively located reliefs 71 in the insulative board, to interface terminals 72 and 72' which mechanically engage the conductive ridge to facilitate electrical continuity therewith. Alternatively, the strip stock can be disposed within the insulative board 34 such that the conductive ridge provided by the strip stock exceeds a top surface 70 of the insulative board 34, projecting outwardly therefrom, also shown in FIG. 4A.

The strip stock, used to effect the conductive buses 66, can be selected to be of dimensions suitable for various current carrying capabilities. In this illustrative embodiment, low current or low amp conductors are effected by using strip stock which is 0.81 mm × 2.8 mm. High current carrying conductors are effected using strip stock which is 0.81 mm × 4.8 mm. Such strip stock is available in rolls or spools of varying lengths. Strips 73 are cut to length in accordance with the desired routing and are disposed within the recesses to provide point to point electrical continuity, as shown in FIG.

7E. Alternatively, as shown in FIG. 7E, the strip stock is disposed within the recesses directly from the spool or reel 75 and cut to length. In either case, waste is virtually eliminated in such an implementation of conductive buses. It should be noted that the recesses in the illustrative embodiment are dimensioned to facilitate a friction fit of the strip stock within the recess However, tabs (not shown) or other engagement means can be implemented to assure retention of the strips within the recesses.

Figure 5A:
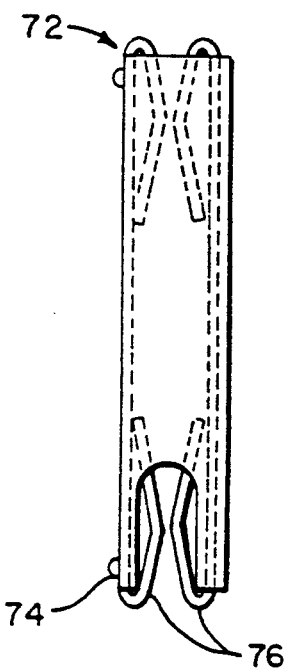
FIG. 5A is a side view of a female-female interface terminal for interfacing with a conductive ridge formed by the strip stock disposed in recesses in the insulative portions of the power distribution center disclosed.
Figure 6A:
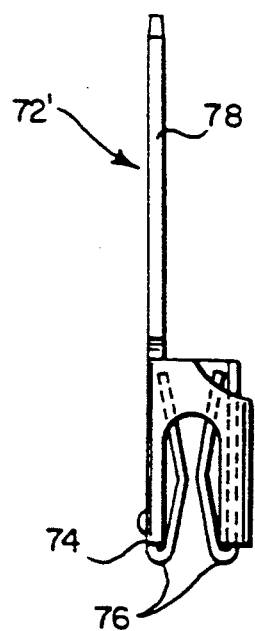
FIG. 6A is a side view of a male-female interface terminal for interfacing with a conductive ridge formed by the strip stock disposed in recesses in the insulative portions of the power distribution center disclosed.

Interface terminals configured to be compatible and electrically engageable with the conductive ridge effected by the strip stock disposed within the recesses as described hereinbefore include at least one female portion 74, as illustrated in FIGS. 4A, 5A and 6A. The female portion 74 is comprised of a pair of resilient opposed spring beams 76 which define a void for receiving the conductive ridge. A top portion either continuous with or attached to the female portion 74, provides a means for interconnecting with the interface terminal and ultimately with the conductive ridge and associated conductive bus 66.

Figure 5B:
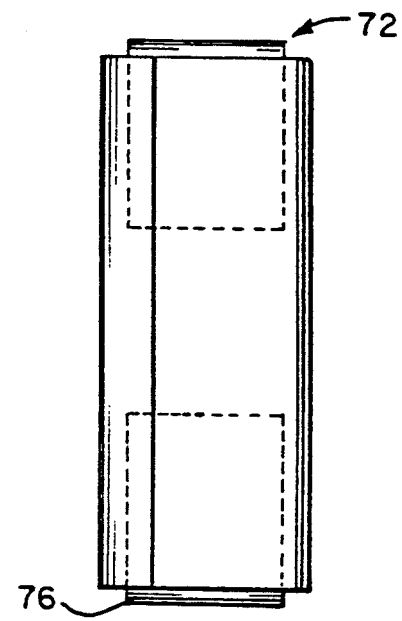
FIG. 5B is a rear view of the female-female interface terminal of FIG. 5A.
Figure 6B:
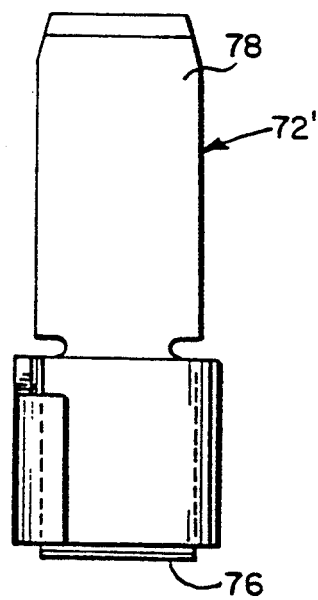
FIG. 6B is a rear view of the male-female interface terminal of FIG. 6A.

In one illustrative embodiment of an interface terminal, illustrated in FIGS. 5A and 5B, the interface terminal 72 has an upper portion which, like the female portion 74, is a female receptacle comprised of resilient opposed spring beams effecting a void for receiving therein a terminal blade or the male portion of some conductive element. The female/female interface terminal 72 receives male conductive elements providing a conductive interface therebetween. Another embodiment of an interface terminal 72', illustrated in FIGS. 6A and 6B is comprised of a female portion 74 for interfacing with the conductive ridge of a conductive bus 66 and includes a continuous or attached upper portion constituted by a male terminal blade 78. The male terminal blade 78 provides a conductive protuberance which can be received by any of various female receptacles.

The interface terminals 72, 72' including female portions 74, engage the conductive ridge of the conductive bus 66 effected by the strip stock vertically disposed within recesses of the insulative board 34. As illustrated in FIG. 4A, the interface terminal 72 fictionally engages the vertically oriented strip stock by way of its female portion 74, such that the opposed spring beams 76 resiliently accommodate the conductive ridge formed by the strip stock. Electrical continuity is thereby effected and the upper portion of the interface terminal 72, in this case constituted by a female receptacle is available for electrical interconnection to ultimately provide electrical continuity with the conductive bus.

Figure 7B:
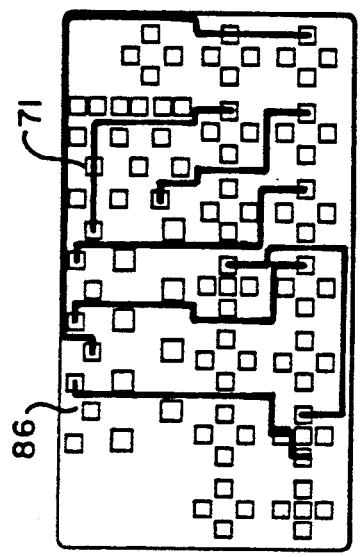
FIGS. 7A and 7B are plan views of top sides of two insulative portions of the exemplary power distribution center having alternative strip stock routing.
Figure 7D:
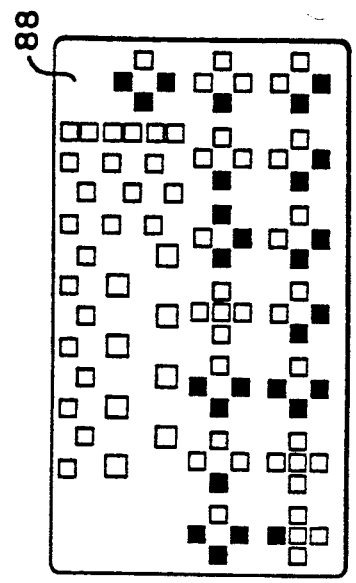
FIGS. 7C and 7D are plan views of bottom sides of the two insulative portions of FIGS. 7A and 7B, respectively, having openings therethrough for providing interface terminals access to conductive ridges.
Figure 7A:
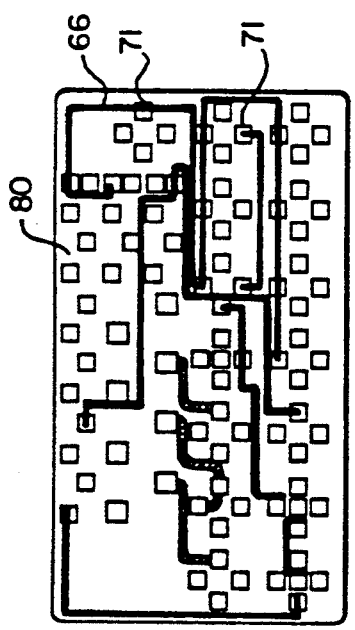

As illustrated in FIGS. 7A and 7B, various patterns of conductive buses 66 may be implemented using the strip stock as described hereinbefore. A first pattern 80 shown in FIG. 7A, provides conductive buses facilitating point to point electrical continuity. Conductive ridges resulting from the strip stock disposed within recesses according to this first pattern 80 are accessible to interface terminals having female portions 74 as discussed hereinbefore. The female portions 74 of the interface terminals can access and mechanically engage the conductive ridge virtually anywhere along the length of the strip stock effecting the conductive bus, connection being made at reliefs (71 in FIGS. 4A, 7A and 7B), in the insulative portion or at areas where the conductive ridge is otherwise accessible to the female portions 74 of the interface terminal. It should be noted that although difficulty would arise in connecting a female portion of an interface terminal at a significant angle along the conductive bus 66, alternative female portions are conceivable and implementable which would facilitate interconnection with the conductive ridge even at points of acute angles.

Figure 7C:
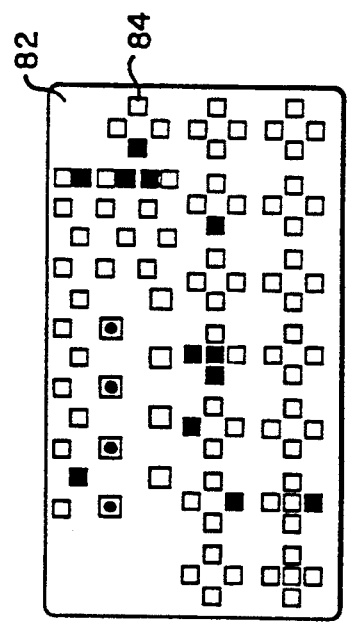

The first pattern 80 of conductive buses effected by strip stock within recesses is also accessible from a bottom surface 82 of the third insulative board 34. As illustrated in FIG. 7C, the bottom surface 82 includes a plurality of openings aligned with the first pattern 80 of conductive buses disposed on the top side of the first insulative board 34. The openings, such as an opening 84, are preferably sized to receive a mating terminal having a female top portion which will engage the conductive bus 66 through the opening 84 from the bottom surface 82 of the insulative board 34. Thus, electrical interconnection is facilitated between stacked boards. It should be noted that bottom surface 82 is configurable with vertically oriented strips effecting conductive ridges as discussed. Undesirable electrical shorts can be substantially precluded by introducing insulative sheets or spacers having suitable openings therethrough, between insulative boards such as the insulative spacer 36 of FIG. 3.

An alternative pattern of conductive buses, as illustrated in FIG. 7B, provides a pattern associated with the top side 86 of the second insulative board 35. As with the first pattern 80 on the insulative board 34, the pattern on the top side 86 is also accessible from a bottom side 88 of the second insulative board 35, via openings passing therethrough. Such openings, as illustrated in FIG. 7B permit physical and electrical access to the conductive pattern effected on the top side 86 of the second insulative board 35 by strip stock disposed in recesses thereon.

While the invention is illustrated and described with respect to power distribution centers distributing electrical signals in the context of an automotive environment, it should be appreciated that the means of distributing electrical signals described herein is applicable in various other environments, including electrical home appliances, office equipment, aircraft assemblies or the like.

Although an illustrative power distribution center is disclosed herein, having two insulative portions with conductive patterns implemented on both sides thereof, it will be appreciated that any number of insulative boards can be implemented having a virtually limitless number of conductive patterns effected thereby. It should be appreciated that while conductive ridges are effected as described herein by disposing strip stock in recesses on "both" sides of the insulative boards, such conductive patterns can be implemented on other sides of such insulative boards by configuring recesses thereon and disposing strip stock therein. Additionally, while "top" and "bottom" are used to describe surfaces of the insulative board, such description is not provided to limit in any way the physical orientation of such boards.

While illustrative embodiments of interface terminals are disclosed herein comprising lower portions effecting a female receptacle and upper portions including a similar female receptacle and alternatively a male terminal blade for electrical interconnection with other elements, it will be appreciated by those of ordinary skill in the art that various alternative interface terminals can be implemented having various combinations for interconnectability, such as interface terminals having a female lower portion for interconnecting with the conductive ridge of a conductive bus as described hereinbefore and an upper portion constituted by a post which receives a wire, such as by wire wrapping or other attachment means.

While accessibility to the conductive buses effected by strip stock disposed within recesses in insulative portions of the power distribution center discussed hereinbefore, is described herein as being through openings in the insulative boards or via interface terminals on the top side of the insulative boards, it will be appreciated that various other modes of accessing the conductive buses effected by strip stock within the recesses of the insulative boards can be implemented. For instance, conductive ridges of the buses can be made accessible by disposing portions thereof above the surface of the insulative board. Further, such accessibility to conductive buses can be implemented through side portions of the insulative boards or by tapping additional conductors off of interface terminals associated with any of various conductive buses.

Although the invention has been shown and described with respect to exemplary embodiments thereof, various other changes, omissions and additions in form and detail thereof may be made therein without departing from the spirit and scope of the invention.

What is claimed is:

1. A power distribution center of the type generally used in an automotive electrical system for housing fuses and relays, comprising:
   at least one insulative housing;
   at least one insulative board disposed within said insulative housing, said at least one insulative board having at least one substantially planar surface and a plurality of recesses disposed therein;
   at least one conductive bus comprising strip stock, said strip stock being of a type to be flexibly configurable into an angled pattern as it is placed into at least one of said plurality of recesses and having a substantially rectangular cross-section including a height and a width that is greater than said height, said strip stock being disposed and oriented within at least one of said plurality of recesses via a friction fit and having said width orthogonally disposed with respect to said at least one substantially planar surface to form a conductive ridge, said conductive ridge being accessible for electrical interconnection therealong; and
   at least one interface terminal engaging said conductive ridge at portions of said conductive ridge which are exposed to receive said at least one interface terminal, said at least one interface terminal including at least one female portion for mechanically and electrically engaging said conductive ridge for providing electrical continuity therewith.

2. The power distribution center of claim 1, wherein said conductive ridge protrudes above said substantially planar surface and said at least one interface terminal comprises at least one female portion engaging said conductive ridge at any position therealong and at least a second interface portion.

3. The power distribution center of claim 2, wherein said second interface portion is a second female portion for interfacing with a male interface.

4. The power distribution center of claim 2, wherein said second interface portion is a male portion for interfacing with a female interface.

5. The power distribution center of claim 1, further including a second insulative board having at least one substantially planar surface with a plurality of recesses disposed therein, and having at least one conductive bus strip forming at least one conductive ridge disposed at least partially within said plurality of recesses, said at least one conductive bus strip of said second insulative board being electrically interconnected to said at lest one conductive bus of said at least one insulative board.

6. The power distribution center of claim 5, further including an insulative spacer between said at least one insulative board and said second insulative board.

7. The power distribution center of claim 1, wherein said strip stock is cut to length prior to being disposed within said at least one of said plurality of recesses.

8. The power distribution center of claim 1, wherein said strip stock is removed form a spool or reel and cut to length as it is being disposed within said at least one of said plurality of recesses.

9. A method of implementing conductive traces within an electrical assembly of the type generally used in an automotive electrical system for housing fuses and relays, said method comprising the steps of:
   configuring an insulative portion having at least one substantially planar surface with a plurality of recesses;
   selecting at least one of said plurality of recesses for routing electrical signals therealong;
   selecting an appropriate length of strip stock to form at least one conductive element, said strip stock being of a type to be flexibly configurable into an angled pattern as it is placed into said selected at least one of said plurality of recesses and having a substantially rectangular cross-section including a height and a width that is greater than said height; and
   disposing said at least one conductive element via friction fit within said selected at least one of said plurality of recesses, by vertically orienting said at least one conductive element within said selected at least one of said plurality of recesses having said width orthogonally disposed with respect to said at least one substantially planar surface, such that said at least one conductive element effects a conductive ridge at least a portion of which is exposed and accessible therealong for receiving at least one interface terminal from a surface of said insulative portion.

10. The method of claim 9, wherein said conductive ridge protrudes above said at least one substantially planar surface, further including the step of providing said least one interface terminal including a first portion for mechanically engaging said conductive ridge at any position therealong to provide electrical continuity thereto.

11. The method of claim 10 wherein said first portion is a female receptacle portion, which frictionally engages said conductive ridge at any position therealong.

12. The method of claim 11 wherein said at least one interface terminal includes a second portion electrically connected with said first portion, said second portion being one of a male and a female interface portion.

13. The method of claim 9, wherein said step of disposing conductive elements within said selected ones of said plurality of recesses includes cutting said conductive elements to a desired length prior to disposing said conductive elements within said selected ones of said plurality of recesses.

14. The method of claim 9, wherein said step of disposing conductive elements within said selected ones of said plurality of recesses includes disposing said conductive elements within said selected ones of said plurality of recesses as said conductive element is removed from a spool or reel and then cutting said conductive element to a desired length.

* * * * *

UNITED STATES PATENT AND TRADEMARK OFFICE
CERTIFICATE OF CORRECTION

PATENT NO. : 5,310,353
DATED : May 10, 1994
INVENTOR(S) : Steven R. Parrish, et al It is certified that error appears in the above-indentified patent and that said Letters Patent is hereby corrected as shown below:

Column 5, line 7, "recess However" should read --recess. However--.

Column 8, line 3, "lest" should read --least--.

Signed and Sealed this

Sixth Day of September, 1994

Attest:

BRUCE LEHMAN

Attesting Officer

Commissioner of Patents and Trademarks